US012663710B2

(12) United States Patent
Yoo et al.

(10) Patent No.: US 12,663,710 B2
(45) Date of Patent: *Jun. 23, 2026

(54) PELLICLE HAVING VENT HOLE

(71) Applicant: TAIWAN SEMICONDUCTOR MANUFACTURING COMPANY, LTD., Hsinchu (TW)

(72) Inventors: Chue San Yoo, Hsinchu (TW); Chih-Chiang Tu, Hsinchu (TW); Chien-Cheng Chen, Hsinchu (TW); Jong-Yuh Chang, Hsinchu (TW); Kun-Lung Hsieh, Hsinchu (TW); Pei-Cheng Hsu, Hsinchu (TW); Hsin-Chang Lee, Hsinchu (TW); Yun-Yue Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/744,028

(22) Filed: Jun. 14, 2024

(65) Prior Publication Data

US 2024/0329517 A1 Oct. 3, 2024

Related U.S. Application Data

(63) Continuation of application No. 17/497,337, filed on Oct. 8, 2021, now Pat. No. 12,013,632, which is a
(Continued)

(51) Int. Cl.
*G03F 1/62* (2012.01)
*G03F 1/22* (2012.01)
(Continued)

(52) U.S. Cl.
CPC .................. *G03F 1/68* (2013.01); *G03F 1/22* (2013.01); *G03F 1/62* (2013.01); *G03F 1/64* (2013.01); *G03F 1/82* (2013.01); *G03F 7/2004* (2013.01)

(58) Field of Classification Search
CPC .................. G03F 1/62; G03F 1/64; G03F 1/22
See application file for complete search history.

(56) References Cited

U.S. PATENT DOCUMENTS 4,737,387 A * 4/1988 Yen ........................... G03F 1/64
355/122
5,327,808 A 7/1994 Nagata et al.
(Continued)

FOREIGN PATENT DOCUMENTS

CN 101581877 11/2009
CN 105652588 6/2016
(Continued)

OTHER PUBLICATIONS

Office Action dated Aug. 23, 2021 from corresponding application No. CN 201810141775.9.

*Primary Examiner* — Daborah Chacko-Davis
(74) *Attorney, Agent, or Firm* — Hauptman Ham, LLP

(57) ABSTRACT

A pellicle includes a frame having an attachment surface configured to attach to a photomask, wherein the frame comprises a vent hole. The pellicle further includes a filter covering the vent hole, wherein the filter directly contacts an inner surface of the frame, and the filter extends in a direction parallel to the attachment surface. The pellicle further includes a membrane extending over a top surface of the frame.

20 Claims, 5 Drawing Sheets

Related U.S. Application Data continuation of application No. 15/798,872, filed on Oct. 31, 2017, now Pat. No. 11,143,952.

(60) Provisional application No. 62/564,402, filed on Sep. 28, 2017.

(51) Int. Cl.
| | | |
|---|---|---|
| *G03F 1/64* | (2012.01) | |
| *G03F 1/68* | (2012.01) | |
| *G03F 1/82* | (2012.01) | |
| *G03F 7/20* | (2006.01) | |

(56) References Cited

U.S. PATENT DOCUMENTS

| | | | |
|---|---|---|---|
| 6,833,222 | B1 | 12/2004 | Buzerak et al. |
| 8,764,995 | B2 | 7/2014 | Chang et al. |
| 8,796,666 | B1 | 8/2014 | Huang et al. |
| 8,828,625 | B2 | 9/2014 | Lu et al. |
| 8,841,047 | B2 | 9/2014 | Yu et al. |
| 8,877,409 | B2 | 11/2014 | Hsu et al. |
| 9,093,530 | B2 | 7/2015 | Huang et al. |
| 9,184,054 | B1 | 11/2015 | Huang et al. |
| 9,256,123 | B2 | 2/2016 | Shih et al. |
| 9,529,268 | B2 | 12/2016 | Chang et al. |
| 9,548,303 | B2 | 1/2017 | Lee et al. |
| 11,106,127 | B2 | 8/2021 | Lin |
| 11,143,952 | B2 | 10/2021 | Yoo et al. |
| 12,007,685 | B2 | 6/2024 | Lin |
| 12,013,632 | B2 | 6/2024 | Yoo |
| 2002/0090558 | A1 | 7/2002 | Shirasaki |
| 2002/0181092 | A1 | 12/2002 | Wang |
| 2003/0207182 | A1 | 11/2003 | Shirasaki |
| 2004/0137339 | A1* | 7/2004 | Zhang ................. G03F 7/70983 430/5 |
| 2005/0048376 | A1 | 3/2005 | Eschbach et al. |
| 2006/0110664 | A1 | 5/2006 | Hamada |
| 2010/0059083 | A1 | 3/2010 | Tsou |
| 2011/0129767 | A1 | 6/2011 | Shirasaki et al. |
| 2012/0202001 | A1 | 8/2012 | Hamada et al. |
| 2016/0299421 | A1 | 10/2016 | Horikoshi |
| 2017/0088755 | A1 | 3/2017 | Yoo et al. |
| 2017/0184957 | A1 | 6/2017 | Kohmura et al. |
| 2017/0343894 | A1 | 11/2017 | Ishito |
| 2018/0284598 | A1 | 10/2018 | Schniders |
| 2018/0329314 | A1 | 11/2018 | Kruizinga et al. |
| 2019/0094682 | A1 | 3/2019 | Liu et al. |
| 2019/0094683 | A1 | 3/2019 | Yoo et al. |

FOREIGN PATENT DOCUMENTS

| | | |
|---|---|---|
| CN | 106796391 | 5/2017 |
| TW | 20080432 | 2/2008 |
| TW | 200947114 | 11/2009 |
| TW | 201712426 | 4/2017 |

* cited by examiner

100

102 — Attach pellicle including a membrane to a photomask

104 — Perform lithography using the photomask including the attached pellicle

106 — Remove the membrane from a pellicle frame

108 — Remove the pellicle frame from the photomask

110 — Clean the photomask to remove residue adhesive

PELLICLE HAVING VENT HOLE

RELATED APPLICATION

This application is a continuation of U.S. application Ser. No. 17/497,337, filed Oct. 8, 2021, now U.S. Pat. No. 12,013,632, issued Jun. 18, 2024, which is a continuation of U.S. application Ser. No. 15/798,872, filed Oct. 31, 2017, now U.S. Pat. No. 11,143,952, issued Oct. 12, 2021, which claims the priority of U.S. Provisional Application No. 62/564,402, filed Sep. 28, 2017, which are incorporated by reference in their entireties.

BACKGROUND

A pellicle is used to cover a portion of a photomask used to transfer a pattern to a wafer using a photolithography process. The pellicle includes a frame attached to the photomask and a membrane extending across a top of the frame. The pellicle helps to prevent particles from contacting the photomask and introducing distortions to the pattern to be transferred to the wafer.

In some instances, the pellicle is removed from the photomask. For example, a pellicle is removed if the membrane becomes hazy or damaged, in some instances. The removal process for separating the pellicle from the photomask increases a risk of breaking of the membrane.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
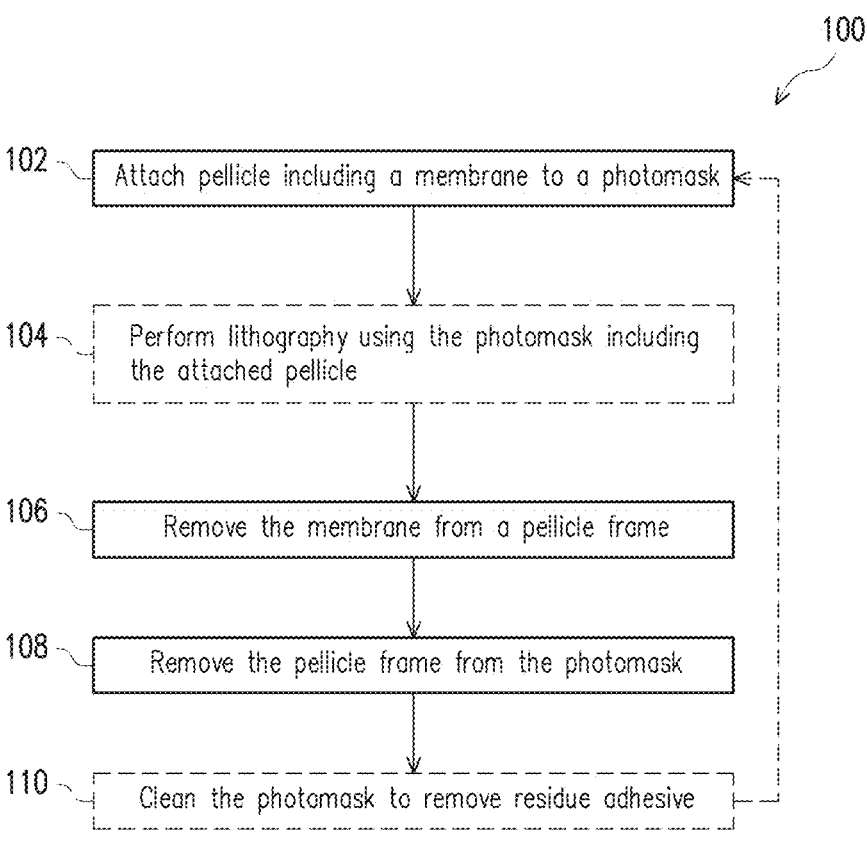
FIG. 1 is a flow chart of a method of removing a pellicle from a photomask in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Pellicles are used to protect patterns on photomasks by providing a physical barrier between a patterned surface of the photomasks and a surrounding environment. The patterned surface of a photomask corresponds to a pattern to be transferred to a wafer or a layer on a wafer through a photolithography process. Debris from the ambient environment which is present on the patterned surface of the photomask during the photolithography process causes errors or distortions in patterns transferred to the wafer, in some instances. Pellicles help to avoid these errors and distortions by preventing debris from coming into contact with the patterned surface of the photomask.

In some embodiments, the photolithography process is performed with the pellicle between the patterned surface of the photomask and a light source of a photolithography tool. The light source of the photolithography tool is a high energy light source. For example, in some embodiments, the light source is a vacuum ultraviolet (VUV) light source; an extreme ultraviolet (EUV) light source; an electron beam (e-beam) source; or another suitable light source. In some instances, repeated expose to a high energy light source causes hazing of a membrane of the pellicle, which obscures the patterned surface of the photomask. In order to restore the usability of the photomask, the pellicle is removed and replaced with a new pellicle.

In some instances, a pellicle is damaged as a result of incidents other than exposure to light sources of photolithography tools. For example, in some instances, pellicles are damaged during shipping, handling during a manufacturing process, or other similar incidents. Damaged pellicles are also removed and replaced in order to restore the usability of the photomask.

During the removal process, there is a high risk of breaking the membrane of the pellicle. In some embodiments, the membrane includes a silicon-based material. Debris from a broken membrane has a risk of damaging the patterned surface of the photomask. In addition, silicon-based debris acts as an eye irritate when dispersed in the air; and causes irritation of lungs when inhaled. In order to reduce the risk of damage to the photomask and irritation to operators during a semiconductor manufacturing process, the current disclosure provides methods and systems for removing the membrane from a pellicle frame. As described below, the membrane is able to be removed from the pellicle frame with a reduced amount of debris from the removed membrane in comparison with other approaches for removing pellicles.

FIG. 1 is a flow chart of a method 100 of removing a pellicle from a photomask in accordance with some embodiments. In operation 102, a pellicle is attached to a photomask. The pellicle includes a membrane and frame having at least one vent hole and a filter. A mounting frame is attached to a bottom surface of the membrane between the membrane and the frame. The pellicle is attached to the photomask in an area surrounding a patterned surface of the photomask. The membrane of the pellicle extends over the patterned surface of the photomask to permit radiation to pass through the membrane to contact the patterned surface. In some embodiments, the pellicle is attached to the photomask using an adhesive. In some embodiments, the pellicle is attached to the photomask using at least one suction cup, vacuum pressure, electrostatic stickers or other suitable attachment devices. In some embodiments, attaching the pellicle to the photomask includes heating the photomask. In some embodiments, a frame of the pellicle is attached to the photomask prior to the membrane being attached to the frame. In some embodiments, the membrane is attached to the frame prior to the pellicle being attached to the photomask.

In operation 104, a photolithography process is performed using the photomask with the pellicle attached to the photomask. In some embodiments, the photolithography process is a VUV photolithography process, an EUV photolithography process, an e-beam photolithography process or another suitable photolithography process. A height of the pellicle frame from the patterned surface of the photomask is selected to position the membrane out of focus of radiation passing through the membrane to contact the patterned surface.

Operation 104 is an optional operation. In some embodiments, method 100 does not include operation 104. In some embodiments, operation 104 is omitted when the pellicle is damaged during shipping or handling of the photomask. In some embodiments, operation 104 is omitted when the photolithography process is performed without the pellicle positioned between the light source of the photolithography tool and the patterned surface.

In operation 106, the membrane is removed from the pellicle frame. Removing the membrane from the pellicle frame in a separate operation from removing the pellicle frame from the photomask helps to reduce the risk of breaking the membrane during removal of the pellicle frame from the photomask. In some embodiments, the membrane is removed from the pellicle frame using a vacuum tool. In some embodiments, the membrane is removed from the pellicle frame using an adhesive on the membrane and a mechanical tool for pulling the adhesive and membrane off the pellicle frame. In some embodiments, the membrane is removed from the pellicle frame by placing the pellicle in a solution and rapidly removing the pellicle from the solution in order to pull the membrane off the pellicle frame. In some embodiments, the solution is pure water, a water-based solution or another suitable solution. In some embodiments, the solution weakens or dissolves the membrane. In some embodiments, the solution weakens or dissolves an adhesive attaching the membrane to the pellicle frame.

In operation 108, the pellicle frame is removed from the photomask. A process for removing the pellicle frame from the photomask depends on a process used to attach the pellicle to the photomask in operation 102. In some embodiments where the pellicle is attached to the photomask by an adhesive, the process for removing the pellicle frame includes heating the photomask. In some embodiments where the pellicle is attached to the photomask by at least one suction cup, the process for removing the pellicle frame includes exerting mechanical force on an edge of the pellicle frame. In some embodiments where the pellicle is attached to the photomask by a vacuum, the pellicle frame is removed simultaneously with removing the membrane because the removal of the membrane releases the vacuum between the pellicle and the photomask. In some embodiments where the pellicle is attached to the photomask by an electrostatic sticker, the process for removing the pellicle frame includes exerting a mechanical force on the pellicle frame. In some embodiments, multiple processes are used to remove the pellicle frame from the photomask. For example, in some embodiments, a combination of heating and mechanical force are used to remove the pellicle frame from the photomask.

In operation 110, the photomask is cleaned to remove residue adhesive from the photomask. In some embodiments, the cleaning process includes using a cleaning solution to dissolve the adhesive remaining on the photomask. In some embodiments, the cleaning process includes a grinding or planarization process to remove the residue adhesive. In some embodiments, the cleaning process includes a selective etching process to selectively remove the residue adhesive. In some embodiments, the cleaning process includes multiple processes. For example, in some embodiments, the cleaning process includes a planarization process in combination with supplying a cleaning solution to the photomask.

Operation 110 is an optional operation. Operation 110 is omitted when operation 108 does not result in residue adhesive remaining on the photomask following removal of the pellicle frame. For example, when the pellicle is attached to the photomask by at least one suction cup, the process for removing the pellicle frame does not result in residue adhesive remaining on the photomask. Therefore, in this situation, operation 110 is omitted.

In some embodiments, following operation 110 a new pellicle is attached to the same photomask and the photomask is used for another photolithography process. In some embodiments, additional operations are included in method 100. In some embodiments, at least one operation is performed simultaneously with another operation.

Figure 2A:
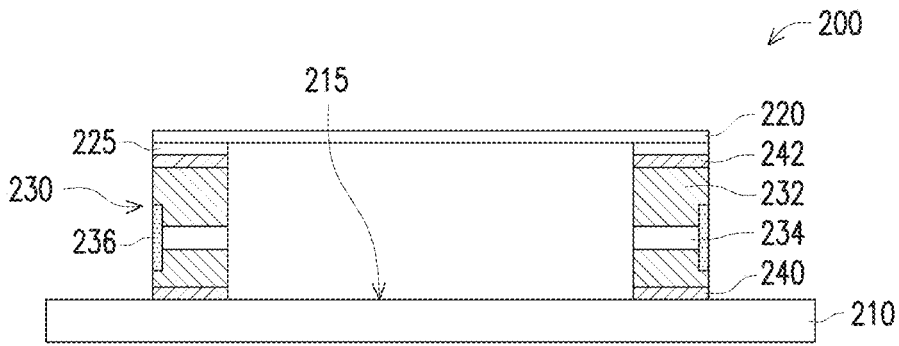
FIG. 2A is a cross-sectional view of a pellicle connected to a photomask in accordance with some embodiments.

FIG. 2A is a cross-sectional view 200 of a pellicle attached to a photomask 210 in accordance with some embodiments. In some embodiments, FIG. 2A is a structure following operation 102 of method 100 (FIG. 1). Photomask 210 includes a patterned surface 215, which contains features corresponding to a pattern to be transferred to a wafer. The pellicle includes a membrane 220 extending across a pellicle frame 230. Membrane 220 extends over the entire patterned surface 215 to protect the patterned surface 215 from debris. Mount 225 is between membrane 220 and pellicle frame 230. Pellicle frame 230 includes a support structure 232; a vent hole 234 and a filter 236. Vent hole 234 provides fluid communication between an ambient environment and an area over patterned surface 215 enclosed by membrane 220 and pellicle frame 230. Adhesive 240 secures pellicle frame 230 to photomask 210. Adhesive 242 secures membrane 220 to pellicle frame 230 by way of mount 225.

Photomask 210 includes patterned surface 215 for patterning an image onto a wafer by a photolithographic process. In some embodiments, photomask 210 includes a substrate having a backside coating layer, a multi-layer structure, a capping layer, one or more absorbers, one or more anti-reflective coating (ARC) layers or other suitable elements. In some embodiments, the substrate includes a low thermal expansion material (LTEM) substrate (e.g., such as $TiO_2$ doped $SiO_2$). In some embodiments, the substrate has a thickness ranging from about 6.3 millimeters (mm) to about 6.5 mm. The thickness of the substrate helps to provide mechanical strength for photomask 210. If the thickness is too small, a risk for breakage or warping increases, in some instances. If the thickness is too great, a weight of photomask 210 is needlessly increased, in some instances. In some embodiments, the backside coating layer includes a chromium nitride ($Cr_xN_y$) layer. In some embodiments, the backside coating layer has a thickness of ranging from about 70 mm to about 100 nm. The thickness of the backside coating layer helps to ensure reflection of incident radiation. If the thickness is too small, a risk of radiation passing through the backside coating layer increases, in some instances. If the thickness is too great, material is wasted and production cost is increased without a significant increase in performance, in some instances. In some embodiments, the multi-layer structure includes molybdenum-silicon (Mo—Si) multi-layers on top of the substrate. In some embodiments, the Mo—Si multi-layers are deposited using an ion deposition technique. In some embodiments, the multi-layer structure has a thickness ranging from about 250 mm to about 350 nm. In some embodiments, each Mo layer has a thickness ranging from about 3 nm to about 4 nm. In some embodiments, each Si layer has a thickness ranging from about 4 nm to about 5 nm. The thickness of the multi-layer structure and each of the individual layers help to maximize constructive interference of incident radiation. If the thickness is too great or too small, the constructive interference for a wavelength of the incident radiation is reduced, in some instances. In some embodiments, the multi-layer structure includes molybdenum/beryllium layer pairs. In some embodiments, the capping layer includes a ruthenium (Ru) capping layer. In some embodiments, the Ru capping layer has a thickness ranging about 2.5 nm to about 3 nm. In some embodiments, the capping layer includes a Si capping layer. In some embodiments, the Si capping layer has a thickness ranging from about 4 nm to about 4.5 nm. The thickness of the capping layer helps to extend the useful life of the multi-layer structure. If the thickness is too small, a useful life of photomask 210 is reduced, in some instances. If the thickness is too great, material is wasted without a significant increase in performance, in some instances. In some embodiments, the absorbers include a $Ta_xN_y$ layer or a $Ta_xB_yO_zN_u$ layer. In some embodiments, each of the absorbers has a thickness ranging from about 50 nm to about 75 nm depending on the wavelength of the incident radiation. In some embodiments, other materials are used for the absorbers, such as Al, Cr, Ta, and W, among others. The thickness of the absorbers helps to prevent unwanted reflection of incident radiation. If the thickness is too small, a risk of unwanted reflection increases, in some instances. If the thickness is too great, material is wasted without a significant increase in performance, in some instances. In some examples, the ARC layers include at least one of a $Ta_xB_yO_zN_u$ layer, a $Hf_xO_y$ layer, a $Si_xO_yN_z$ layer or other suitable anti-reflective materials for the wavelength of the incident radiation.

In some embodiments, photomask 210 is a binary intensity mask (BIM) or a phase-shifting mask (PSM). An illustrative BIM includes opaque absorbing regions and reflective regions in the patterned surface 215. The opaque absorbing regions include an absorber, as described above, which is configured to absorb incident radiation. In the reflective regions, the absorber has been removed and the incident light is reflected by the multi-layer structure. An illustrative PSM utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) on either side of each patterned mask feature. In some embodiments, an AttPSM includes an absorber layer having a transmittance greater than zero. In some embodiments, a cPSM is described as a 100% transmission AltPSM, because the cPSM does not include phase shifter material or chrome.

As described above, photomask 210 includes patterned surface 215 used to transfer patterns onto a wafer by photolithography. To achieve a high fidelity pattern transfer from patterned surface 215 to the wafer, the photolithography process should be defect free. Particles unintentionally deposited on patterned surface 215 result in degradation of the transferred patterns. Particles may be introduced by any of a variety of methods such as during CMP, a cleaning process, and/or during handling of photomask 210.

The pellicle is used to prevent the particles from reaching photomask 210 and interfering with the pattern transfer. Pellicle frame 230 has a height selected to position membrane 220 out of focus of radiation passing through membrane 220 to patterned surface 215. Membrane 220 includes a material having sufficient mechanical strength avoid warping to an extent that would negatively impact a photolithography process when attached to pellicle frame 230. In some embodiments, membrane 220 includes one or more materials including silicon, polymer, silicon nitride (SiN), polycrystalline silicon (poly-Si), silicon carbide (SiC), ruthenium (Ru), a SiN/poly-Si/SiN sandwich film stack, a Si-based compound, other suitable materials, and/or a combination thereof.

Properties of membrane 220 are selected based on the photolithography process used to transfer the pattern of patterned surface 215 to the wafer. In some embodiments, membrane 220 has a thickness less than about 100 nm. In some embodiments, membrane 220 has a thickness less than about 50 nm. If a thickness of membrane is too great, a risk of absorbing incident radiation during the photolithography process increases, in some embodiments. In some embodiments, membrane 220 includes multiple layers. For example, in some embodiments, membrane 220 includes a first sublayer of SiN and having a thickness that is less than about 10 nm; a second sublayer of poly-Si having a thickness that is less than about 100 nm; and a third sublayer of SiN having a thickness that is less than about 10 nm.

In some embodiments, membrane 220 has a total thickness variation (TTV) less than about 10 nm. The TTV is a measure of uniformity of membrane 220. As TTV increases differences between a quality of transfer of one portion of patterned surface 215 to the wafer and another portion of patterned surface 215 to the wafer increases, in some instances. In some embodiments, surfaces of membrane 220 have a root mean squared (RMS) roughness that is less than about 10 nm. The RMS roughness impact diffusion of radiation passing through membrane 220. As the RMS roughness increases, diffusion of radiation passing through membrane 220 increases resulting in reduced quality of pattern transfer, in some instances.

Mount 225 is attached to a surface of membrane 220 corresponding to pellicle frame 230. Mount 225 provides a location for securing membrane 220 to pellicle frame 230. Mount 225 is attached to membrane 220 by adhesive, bonding or another suitable attachment process. Mount 225 is attached to membrane 220 prior to attaching membrane 220 to pellicle frame 230. In some embodiments, mount 225 is omitted and membrane 220 directly contacts adhesive 242 for securing membrane 220 to pellicle frame 230. In some embodiments, a material of mount 225 includes aluminum, titanium, tungsten, silicon or another suitable material. In some embodiments, mount 225 has a same material as support structure 232. In some embodiments, mount 225 has a different material from support structure 232.

Pellicle frame 230 is used to position membrane 220 out of focus of radiation incident on patterned surface 215 during the photolithography process. Pellicle frame 230 is secured to photomask 210 by adhesive 240 in a location surrounding patterned surface 215. A shape of pellicle frame 230 is determined based on a shape of patterned surface 215. Pellicle frame 230 includes support structure 232 configured to provide mechanical strength for maintaining a location of membrane 220 relative to photomask 210. Pellicle frame 230 also includes vent hole 234 for providing fluid communication between an ambient environment and a space enclosed by the pellicle and photomask 210. Filter 236 is configured to help prevent particles from entering the space enclosed by the pellicle and photomask 210 through vent hole 234.

In some embodiments, support structure 232 includes aluminum (Al), aluminum oxide, Al-alloy, titanium (Ti), nickel (Ni), gold (Au), silver (Ag), copper (Cu), molybdenum (Mo), platinum (Pt), chromium (Cr), manganese (Mn), iron (Fe), cobalt (Co), palladium (Pd), tantalum (Ta), tungsten (W), silicon, polymer, other suitable materials, and/or combinations thereof. In some embodiments, support structure 232 has a coefficient of thermal expansion (CTE) similar to that of photomask 210 in order to reduce stress exerted on photomask 210 resulting from changes in temperature.

Vent hole 234 extends through support structure 232. Vent hole 234 is a substantially straight opening having sidewalls parallel to a top surface of photomask 210. In some embodiments, vent hole 234 includes at least one change of direction. In some embodiments, vent hole 234 has a tapered profile. In some embodiments, at least one sidewall of vent hole 234 is angled with respect to the top surface of photomask 210. In some embodiments, pellicle frame 230 includes a plurality of vent holes 234 arranged around a circumference of pellicle frame 230. In some embodiments, a first vent hole differs from a second vent hole in at least one of size, shape, number of turns or another feature. A number and size of vent holes in pellicle frame 230 are sufficient to maintain similar pressure in the ambient environment and in the space enclosed by the photomask 210 and the pellicle. Maintaining a similar pressure helps to avoid warping of membrane 220. However, the number and size of vent holes in pellicle frame 230 are not so much as to weaken the mechanical strength of support structure 232.

Filter 236 helps to prevent particles from entering the space enclosed by the pellicle and photomask 210 from the ambient environment through vent hole 234. Filter 236 is located at an outer surface of pellicle frame 230 closest to the ambient environment. In some embodiments, filter 236 is located at an inner surface of pellicle frame 230 farthest from the ambient environment. Filter 236 has pores designed to block particles above a target size from entering vent hole 234. A size of pores in filter 236 is sufficiently large to permit maintaining similar pressure in the ambient environment and in the space enclosed by the photomask 210 and the pellicle. However, the size of the pores in filter 236 are sufficiently small to block particles from pass through vent hole 234.

Adhesive 240 is configured to secure pellicle frame 230 to photomask 210. In some embodiments, adhesive 240 includes a thermosetting adhesive material, e.g., epoxy resin, benzocyclobutene (BCB), methylsilsesqulxane (MSQ), polyimide, other thermosetting materials and/or combinations thereof. In some embodiments, adhesive 240 includes a glue or another material configured to secure pellicle frame 230 to photomask 210.

As noted above, in some embodiments, pellicle frame 230 is secured to photomask 210 in a manner other than adhesive 240, such as at least one suction cup, a vacuum, or an electrostatic sticker. In such embodiments, adhesive 240 is omitted.

Adhesive 242 is configured to secure membrane 220 to pellicle frame 230. In some embodiments, adhesive 242 directly contacts mount 225. In some embodiments, adhesive 242 directly contacts membrane 220. In some embodiments, adhesive 242 includes a thermosetting adhesive material, e.g., epoxy resin, benzocyclobutene (BCB), methylsilsesqulxane (MSQ), polyimide, other thermosetting materials and/or combinations thereof. In some embodiments, adhesive 242 includes a glue or another material configured to secure membrane 220 to pellicle frame 230. In some embodiments, adhesive 242 has a same material as adhesive 240. In some embodiments, adhesive 242 has a different material from adhesive 240.

Figure 2B:
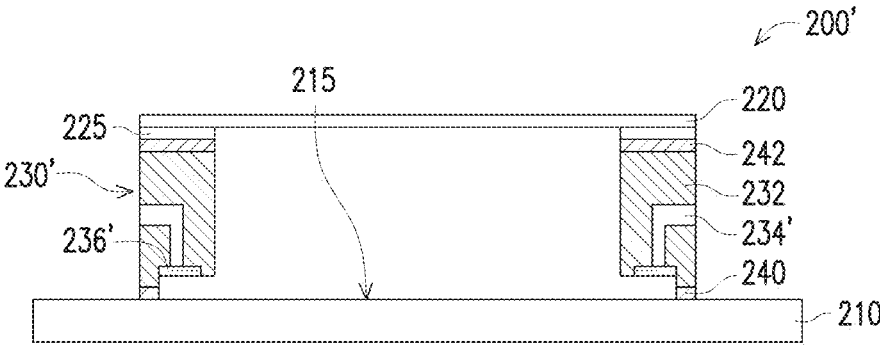
FIG. 2B is a cross-sectional view of a pellicle connected to a photomask in accordance with some embodiments.

FIG. 2B is a cross-sectional view 200' of a pellicle attached to a photomask 210 according to some embodiments. In some embodiments, FIG. 2B is a structure following operation 102 of method 100 (FIG. 1). In comparison with pellicle frame 230 (FIG. 2A), pellicle frame 230' has a reduced contact area with photomask 210. In comparison with vent hole 234, vent hole 234' includes an opening which changes direction. In comparison with filter 236, filter 236' is located on an inner surface of pellicle frame 230' farthest from the ambient environment.

The reduced contact area between pellicle frame 230' and photomask 210 helps to reduce an amount of mechanical force used to remove pellicle frame 230' from photomask 210 in comparison with pellicle frame 230. The reduced mechanical force used for a removal process reduces a risk damage to photomask 210 during the removal process. However, the reduced contact area also concentrates stress exerted on photomask 210 by pellicle frame 230 as a result of handling, shipping, temperature variation, removal or other forces. The concentration of stress increases a risk of damage to the photomask 210.

Vent hole 234' including a change of direction helps to reduce a likelihood of a particle passing through vent hole 234', in comparison with vent hole 234. However, the change in direction also inhibits fluid passing through vent hole 234', in comparison with vent hole 234. As a result, a pressure difference between the space enclosed by the pellicle and photomask 210 and the ambient environment are increased in comparison with pellicle frame 230 including vent hole 234.

Filter 236' located at the inner surface of pellicle frame 230' reduces an amount of particles which contact filter 236' and extends the useful life of filter 236' in comparison with filter 236. However, cleaning or replacing of filter 236' requires removal of pellicle frame 230' from photomask 210. The removal of pellicle frame 230' increases a risk of damage to photomask 210.

Figure 3:
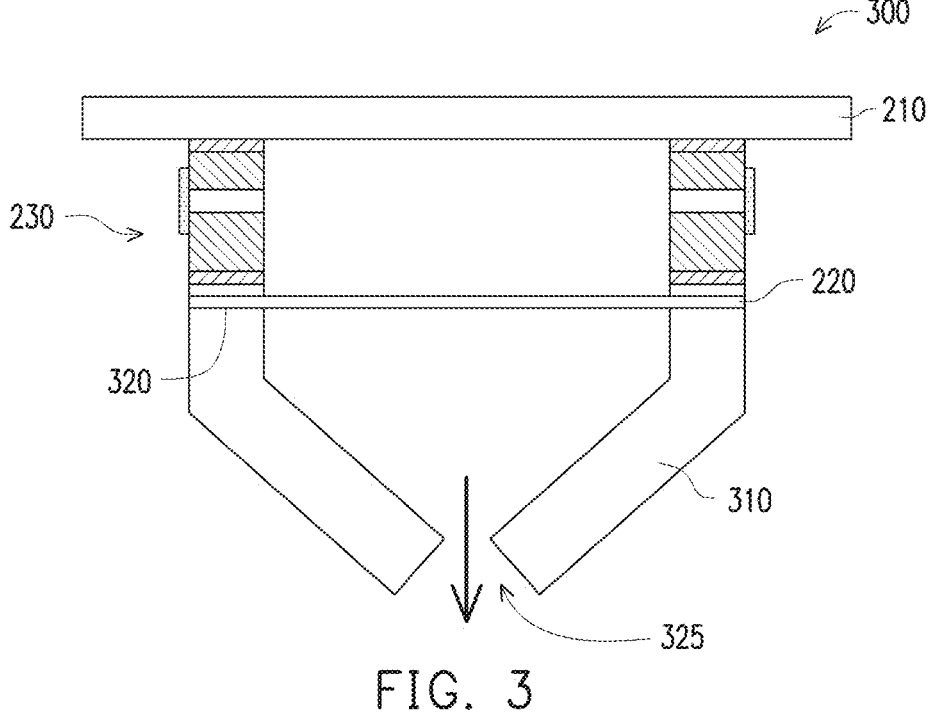
FIG. 3 is a cross-sectional view of a system for removing a membrane from a pellicle frame in accordance with some embodiments.

FIG. 3 is a cross-sectional view of a system 300 for removing a membrane 220 from a pellicle frame 230 in accordance with some embodiments. In some embodiments, system 300 is a view of a system for executing operation 106 of method 100 (FIG. 1). System 300 includes photomask 210, membrane 220, and pellicle frame 230 from FIG. 2A. One of ordinary skill in the art would recognize that the following description is applicable to a system including pellicle frame 230' of FIG. 2B as well as other pellicle frame structures. System 300 further includes a chamber 310 configured to contact membrane 220 at interface 320.

Chamber 310 is configured to contact membrane 220 at a location corresponding to pellicle frame 230. By contacting at the location corresponding to pellicle frame 230, a risk of breaking of membrane 220 prior to removal is reduced. Chamber 310 includes sidewalls which define a tapered profile. System 300 is configured to generate a vacuum, indicated by the arrow, at opening 325. The vacuum acts to extract a central portion of membrane 220, i.e., a portion of membrane extending between pellicle frame 230, from the pellicle. The extracted portion of membrane 220 is pulled through opening 325 by the vacuum. In some embodiments, system 300 includes a trapping or disposal system (not shown) for capturing the extracted portion of membrane 220 following the membrane exiting opening 325.

Interface 320 is configured to create a seal between chamber 310 and membrane 220 in to help with generation of the vacuum. In some embodiments, an oil is applied to chamber 310 at interface 320 to help form the seal. In some embodiments, the seal is formed at interface through the use of an electrostatic sticker, at least one suction cup, a weak adhesive or another suitable material. A weak adhesive is an adhesive whose strength of adhesion to membrane 220 is sufficiently low to avoid damaging photomask 210 by exerting force on pellicle frame 230 during removal of chamber 310 from membrane 220.

By using system 300, a portion of membrane 220 is removed prior to removing pellicle frame 230 from photomask 210. As a result, a risk of particles from a broken membrane 220 contacting photomask 210 or being dispersed into the ambient environment is reduced in comparison with other approaches which attempt to remove the membrane and the pellicle frame in a continuous process or where the membrane is unintentionally removed.

Figure 4:
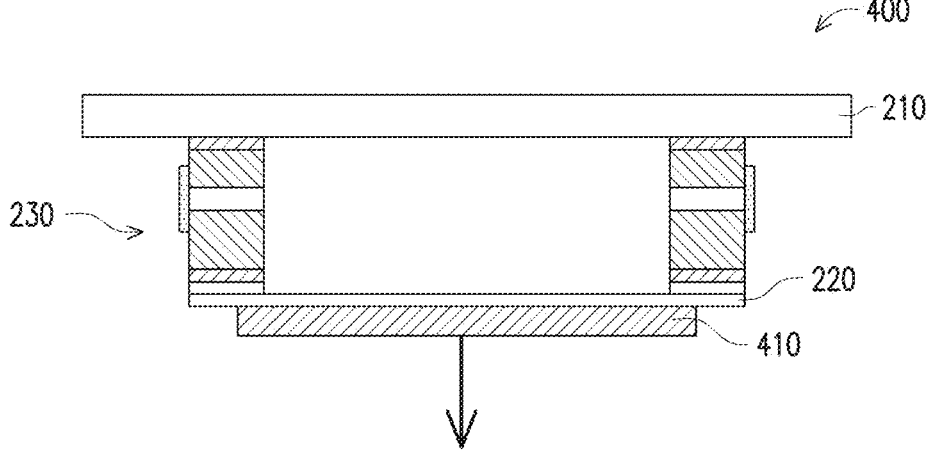
FIG. 4 is a cross-sectional view of a system for removing a membrane from a pellicle frame in accordance with some embodiments.

FIG. 4 is a cross-sectional view of a system 400 for removing a membrane 220 from a pellicle frame 230 in accordance with some embodiments. In some embodiments, system 400 is a view of a system for executing operation 106 of method 100 (FIG. 1). System 400 includes photomask 210, membrane 220, and pellicle frame 230 from FIG. 2A. One of ordinary skill in the art would recognize that the following description is applicable to a system including pellicle frame 230' of FIG. 2B as well as other pellicle frame structures. System 400 further includes adhesive 410 on membrane 220. A mechanical tool (not shown) contacts a side of adhesive 410 opposite membrane 220 in order to pull a central portion of membrane 220 from pellicle frame 230.

Adhesive 410 is configured to secure the mechanical tool to membrane 220. In some embodiments, adhesive 410 includes a thermosetting adhesive material, e.g., epoxy resin, benzocyclobutene (BCB), methylsilsesqulxane (MSQ), polyimide, other thermosetting materials and/or combinations thereof. In some embodiments, adhesive 410 includes a glue or another suitable material. In some embodiments, adhesive 410 is a same material as both adhesive 240 and adhesive 242. In some embodiments, adhesive 410 has a different material from at least one of adhesive 240 or adhesive 242.

In some embodiments, the mechanical tool directly contacts adhesive 410. In some embodiments, the mechanical tool uses a carrier substrate to contact adhesive 410. The mechanical tool then exerts a force on membrane 220 through adhesive 410, as indicated by the arrow, in order to pull the central portion of membrane 220 off of pellicle frame 230. In some embodiments, system 400 includes a system (not shown) for capturing the extracted portion of membrane 220 following removal of the central portion of membrane 220 from pellicle frame 230.

By using system 400, a portion of membrane 220 is removed prior to removing pellicle frame 230 from photomask 210. Adhesive 410 maintains contact with the portion of membrane 220 to help reduce a risk of particles from a broken membrane 220 contacting photomask 210 or being dispersed into the ambient environment in comparison with other approaches which attempt to remove the membrane and the pellicle frame in a continuous process or where the membrane is unintentionally removed.

Figure 5:
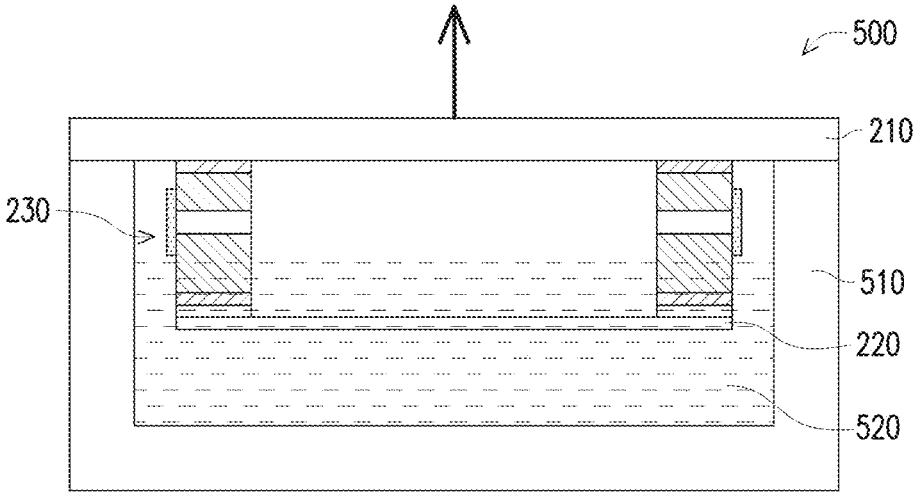
FIG. 5 is a cross-sectional view of a system for removing a membrane from a pellicle frame in accordance with some embodiments.

FIG. 5 is a cross-sectional view of a system 500 for removing a membrane 220 from a pellicle frame 230 in accordance with some embodiments. In some embodiments, system 500 is a view of a system for executing operation 106 of method 100 (FIG. 1). System 500 includes photomask 210, membrane 220, and pellicle frame 230 from FIG. 2A. One of ordinary skill in the art would recognize that the following description is applicable to a system including pellicle frame 230' of FIG. 2B as well as other pellicle frame structures. System 500 further includes container 510 containing a solution 520.

Container 510 is sized to permit pellicle frame 230 to be inserted into container 510, but to help prevent photomask 210 from being inserted into container 510. A volume of solution 520 in containing is sufficient to cover at least membrane 220 following insertion of the pellicle into container 510. The volume of solution 520 is small enough to avoid contact with photomask 210 following insertion of the pellicle into container 510. In some embodiments, the volume of solution 520 is small enough to avoid solution 520 entering vent hole 234 (FIG. 2A).

Following insertion of the pellicle into container 510 and solution 520 covering membrane 220, a mechanical tool is used to pull photomask 210 and pellicle frame 230 away from container 510. A combination of surface tension of solution 520 and pressure difference between solution 520 and the space enclosed by the pellicle and photomask 210 acts on membrane 220 to remove the central portion of membrane 220 from pellicle frame 230. In some embodiments, a controller is used to control the mechanical tool for regulating a removal velocity of photomask 210 and pellicle frame 230 from container 510. If the removal velocity is too high, a risk of damage to photomask 210 increases because of the stress exerted on photomask 210 by pellicle frame 230 in some instances. If the removal velocity is too low, the central portion of membrane 220 is not removed in some instances. In some embodiments, the controller includes at least a processor and a non-transitory computer readable medium connected to the processor. The processor is configured to execute instructions stored on the non-transitory computer readable medium in order to generate instructions for controlling the mechanical tool for removing photomask 210 from container 510.

In some embodiments, the mechanical tool directly contacts photomask 210. In some embodiments, the mechanical tool uses a carrier substrate to contact photomask 210. In some embodiments, the removed portion of membrane 220 remains in solution 520 following removal. In some embodiments, system 500 includes a system (not shown) for disposing of the portion of membrane 220 following removal of the central portion of membrane 220 from pellicle frame 230. In some embodiments, the disposing of the removed portion of membrane 220 occurs after several removal processes, i.e., multiple membranes are removed from solution 520 in a single disposal process.

In some embodiments, solution 520 includes pure water. In some embodiments, solution 520 includes ethanol or another suitable solvent. In some embodiments, solution 520 is configured to weaken or degrade adhesive 242 (FIG. 2A) holding membrane 220 to pellicle frame 230.

By using system 500, a portion of membrane 220 is removed prior to removing pellicle frame 230 from photomask 210. The removed portion of membrane 220 remains in solution 520 to help reduce a risk of particles from a broken membrane 220 contacting photomask 210 or being dispersed into the ambient environment in comparison with other approaches which attempt to remove the membrane and the pellicle frame in a continuous process or where the membrane is unintentionally removed.

Figure 6A:
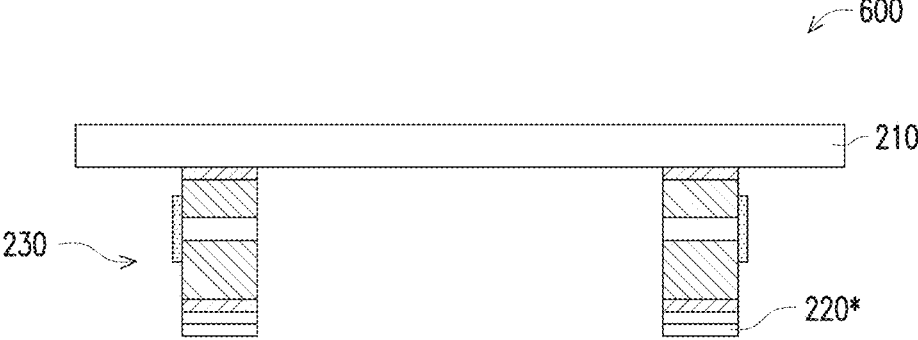
FIGS. 6A, 6B and 6C are cross-sectional views of removing a pellicle frame from a photomask during various stages of processing in accordance with some embodiments.

FIG. 6A is a cross-sectional view 600 of a pellicle frame 230 attached to a photomask 210 following removal of a portion of a membrane in accordance with some embodiments. In some embodiments, view 600 of the photomask 210 and pellicle frame 230 following operation 106 of method 100 (FIG. 1). View 600 includes photomask 210 and pellicle frame 230 from FIG. 2A. One of ordinary skill in the art would recognize that the following description is applicable to an arrangement including pellicle frame 230' of FIG. 2B as well as other pellicle frame structures. In view 600, a portion 220* of membrane 220 remains attached to pellicle frame 230.

Portion 220* is a result of a central portion of membrane 220 being removed in operation 106 of method 100 using a system, such as system 300 (FIG. 3); system 400 (FIG. 4); system 500 (FIG. 5); or another suitable system. In some embodiments, dimensions, e.g., length, width, diameter, etc., of portion 220* are equal to or less or equal to corresponding dimensions of a top surface of pellicle frame 230. In some embodiments, portion 220* protrudes beyond an edge of pellicle frame 230 perpendicular to the top surface of photomask 210.

Figure 6B:
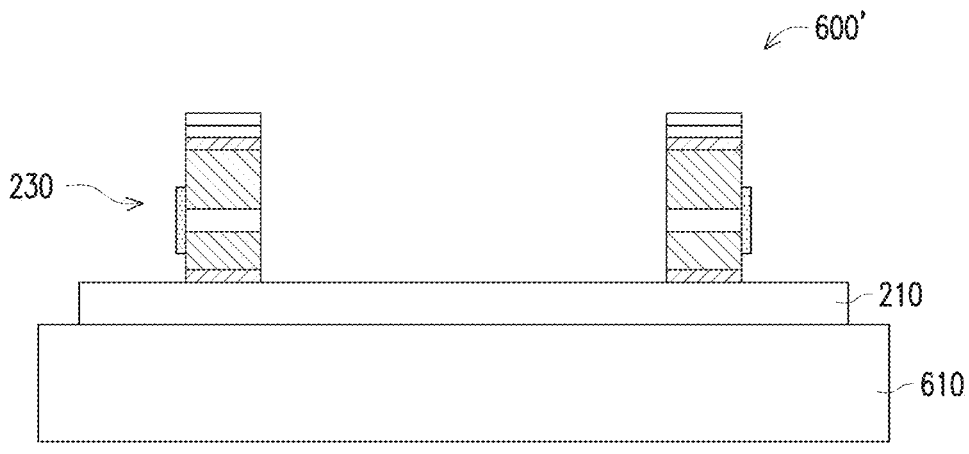

FIG. 6B is a cross-sectional view 600' of a pellicle frame 230 attached to a photomask 210 during removal of pellicle frame 230 from photomask 210 in accordance with some embodiments. In some embodiments, view 600' of the photomask 210 and pellicle frame 230 during operation 108 of method 100 (FIG. 1). View 600' includes photomask 210 and pellicle frame 230 from FIG. 2A. One of ordinary skill in the art would recognize that the following description is applicable to an arrangement including pellicle frame 230' of FIG. 2B as well as other pellicle frame structures. In view 600', a heater 610 is arranged to increase a temperature of photomask 210.

Heater 610 is configured to heat photomask 210 in order to help break down adhesive 240 (FIG. 2A). In some embodiments, a mechanical tool is used in combination of heater 610 to remove pellicle frame 230 from photomask 210. In some embodiments, heater 610 heats photomask 210 to a temperature of about 90 degrees C. to about 150 degrees C. If the temperature is too low, adhesive 240 is not sufficiently degraded to permit removal of pellicle frame 230 without damage to photomask 210, in some instances. If the temperature is too high, a risk of damage to photomask 210 increases, in some instances. In some embodiments, heater 610 heats photomask 210 for a duration of about 1 minute to about 5 minutes. If the duration is too short, adhesive 240 is not sufficiently degraded to permit removal of pellicle frame 230 without damage to photomask 210, in some instances. If the duration is too long, a risk of damage to photomask 210 increases, in some instances. In some embodiments, the mechanical tool acts to pry or pull pellicle frame 230 off of photomask 210. In some embodiments, the mechanical tool acts on pellicle frame 230 to remove the pellicle frame 230 from photomask 210 during a heating process of heater 610. In some embodiments, the mechanical tool acts on pellicle frame 230 to remove the pellicle frame 230 from photomask 210 following completion of a heating process of heater 610.

Figure 6C:
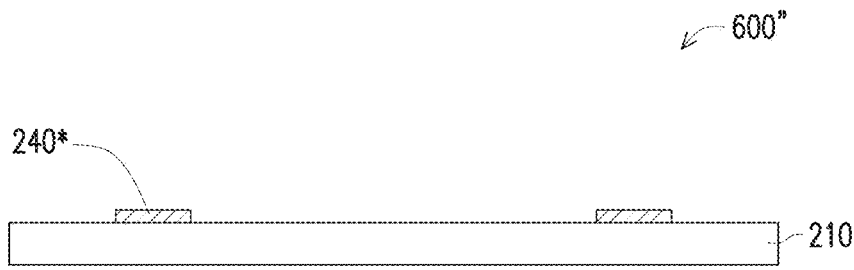

FIG. 6C is a cross-sectional view 600" of residue adhesive 240* attached to a photomask 210 following removal of pellicle frame 230 from photomask 210 in accordance with some embodiments. In some embodiments, view 600" of the photomask 210 and residue adhesive 240* following operation 108 of method 100 (FIG. 1). View 600" includes photomask 210 and residue adhesive 240* resulting from adhesive 240 of FIG. 2A. One of ordinary skill in the art would recognize that the following description is applicable to an arrangement of FIG. 2B as well as other pellicle frame structures. In view 600", residue adhesive 240* remains on photomask 210.

During the removal of pellicle frame 230 a portion of adhesive 240 is removed with the pellicle frame 230; however, residue adhesive 240* of adhesive 240 remains on photomask 210. A cleaning process is used to remove residue adhesive 240* from photomask 210. In some embodiments, the cleaning process includes using a substance such as $O_3$, standard clean 1 (SC1), deionized hydrogen ($DIH_2$), deionized water (DIW), and/or combinations thereof. Alternatively, the cleaning process includes other substances or processes, in other embodiments.

An aspect of this description relates to a pellicle. The pellicle includes a frame having an attachment surface configured to attach to a photomask, wherein the frame comprises a vent hole. The pellicle further includes a filter covering the vent hole, wherein the filter directly contacts an inner surface of the frame, and the filter extends in a direction parallel to the attachment surface. The pellicle further includes a membrane extending over a top surface of the frame. In some embodiments, the vent hole includes a first portion parallel to the attachment surface; and a second portion angled with respect to the attachment surface. In some embodiments, the filter is adjacent to the second portion. In some embodiments, the first portion is adjacent to an outer surface of the frame. In some embodiments, the pellicle further includes an adhesive between the membrane and the frame. In some embodiments, the membrane has a total thickness variation (TTV) of less than 10 nanometers (nm). In some embodiments, the membrane includes multiple layers. In some embodiments, an innermost surface of the frame is perpendicular to the attachment surface. In some embodiments, the filter is outward of the innermost surface of the frame.

An aspect of this description relates to an assembly. The assembly includes a photomask. The assembly further includes a frame having an attachment surface attached to the photomask, wherein the frame comprises a vent hole. The assembly further includes a filter covering the vent hole, wherein the filter directly contacts an inner surface of the frame, and the filter extends in a direction parallel to the photomask. The assembly further includes a membrane extending over a top surface of the frame. In some embodiments, the filter is recessed into the frame. In some embodiments, the filter is spaced from the photomask in a direction perpendicular to the photomask. In some embodiments, a height of the frame positions the membrane out of focus of radiation passing through the membrane to pattern a surface of the photomask. In some embodiments, the attachment surface extends below the filter. In some embodiments, the vent hole includes a first portion parallel to the attachment surface; and a second portion angled with respect to the attachment surface. In some embodiments, the filter is adjacent to the second portion. In some embodiments, the first portion is adjacent to an outer surface of the frame. In some embodiments, the membrane has a thickness of less than 50 nanometers (nm).

An aspect of this description relates to a method of patterning a photomask. The method includes attaching a frame having an attachment surface to the photomask, wherein the frame comprises a vent hole. The method further includes filtering particles, using a filter, to reduce the particles from an ambient environment reaching the photomask, wherein the filter covers the vent hole, and the filter directly contacts an inner surface of the frame. The method further includes positioning a membrane extending over a top surface of the frame out of focus of radiation passing through the membrane for patterning the photomask. The method further includes patterning the photomask using the radiation. In some embodiments, the method further includes removing the membrane from the frame.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle comprising:
a frame having an attachment surface configured to attach to a photomask, wherein the frame comprises a vent hole, and the vent hole comprises:
a first sidewall formed by the frame, wherein the first sidewall is angled with respect to the attachment surface;
a filter covering the vent hole, wherein the filter directly contacts an inner surface of the frame, and the filter extends in a direction parallel to the attachment surface; and
a membrane extending over a top surface of the frame.

2. The pellicle of claim 1, wherein the vent hole further comprises:
a second sidewall formed by the frame, wherein the second sidewall is parallel to the attachment surface.

3. The pellicle of claim 2, wherein the first sidewall is adjacent to an outer surface of the frame.

4. The pellicle of claim 1, wherein the filter is adjacent to the first sidewall.

5. The pellicle of claim 1, further comprising an adhesive between the membrane and the frame.

6. The pellicle of claim 1, wherein the membrane has a total thickness variation (TTV) of less than 10 nanometers (nm).

7. The pellicle of claim 1, wherein the membrane comprises multiple layers.

8. The pellicle of claim 1, wherein an innermost surface of the frame is perpendicular to the attachment surface.

9. The pellicle of claim 8, wherein the filter is outward of the innermost surface of the frame.

10. An assembly comprising:
a photomask;
a frame having an attachment surface attached to the photomask, wherein the frame comprises a vent hole;
a filter covering the vent hole, wherein the filter directly contacts an inner surface of the frame, and the filter extends along a surface of the frame outside the vent hole, and the surface is parallel to the photomask; and
a membrane extending over a top surface of the frame.

11. The assembly of claim 10, wherein the filter is recessed into the frame.

12. The assembly of claim 10, wherein the filter is spaced from the photomask in a direction perpendicular to the photomask.

13. The assembly of claim 10, wherein a height of the frame positions the membrane out of focus of radiation passing through the membrane to pattern a surface of a wafer.

14. The assembly of claim 10, wherein the attachment surface extends below the filter.

15. The assembly of claim 10, wherein the vent hole comprises:
a first portion parallel to the attachment surface; and
a second portion angled with respect to the attachment surface.

16. The assembly of claim 15, wherein the filter is adjacent to the second portion.

17. The assembly of claim 15, wherein the first portion is adjacent to an outer surface of the frame.

18. The assembly of claim 10, wherein the membrane has a thickness of less than 50 nanometers (nm).

19. A method comprising:
attaching a frame having an attachment surface to the photomask, wherein the frame comprises a vent hole, and the vent hole comprises a first sidewall formed by the frame, wherein the first sidewall is angled with respect to the attachment surface;
filtering particles, using a filter, to reduce the particles from an ambient environment reaching the photomask, wherein the filter covers the vent hole, and the filter directly contacts an inner surface of the frame;
positioning a membrane extending over a top surface of the frame out of focus of radiation passing through the membrane; and
patterning a wafer using the radiation.

20. The method of claim 19, further comprising removing the membrane from the frame.

* * * * *